United States Patent [19]

Vassilev et al.

[11] Patent Number: 4,481,482

[45] Date of Patent: Nov. 6, 1984

[54] CLASS BC POWER AMPLIFIER

[75] Inventors: Vassil B. Vassilev; Vassil M. Sofiyanski; Boris V. Vassilev; Panayot Y. Danchev; Angel B. Angelov; Yordan M. Strandjaliev; Georgi S. Kehayov, all of Sofia, Bulgaria

[73] Assignee: Zavod "Elektroakustika", Mihaylovgrad, Bulgaria

[21] Appl. No.: 258,809

[22] Filed: Apr. 29, 1981

[51] Int. Cl.³ .............................................. H03F 3/30
[52] U.S. Cl. ..................................... 330/297; 330/263
[58] Field of Search ........................ 330/263, 267, 297

[56] References Cited

U.S. PATENT DOCUMENTS 3,319,175  5/1967  Dryden ........................... 330/263 X

FOREIGN PATENT DOCUMENTS 53-7160  1/1978  Japan ................................... 330/297

OTHER PUBLICATIONS

Feldman, "Class G High Efficiency HI-FI Amplifier", Radio-Electronics, Aug., 1976, pp. 47–49, 87.

Primary Examiner—James B. Mullins

[57] ABSTRACT

The invention provides a class BC power amplifier which permits control by a circuit with a transistor, which circuit, besides its control functions, effects also a protection of the end stage from transient processes caused by the inductive character of the load. The efficiency of the amplifier is not lowered, but it remains sufficiently high and corresponds to the class BC. The use of an output transformer is not obligatory.

7 Claims, 1 Drawing Figure

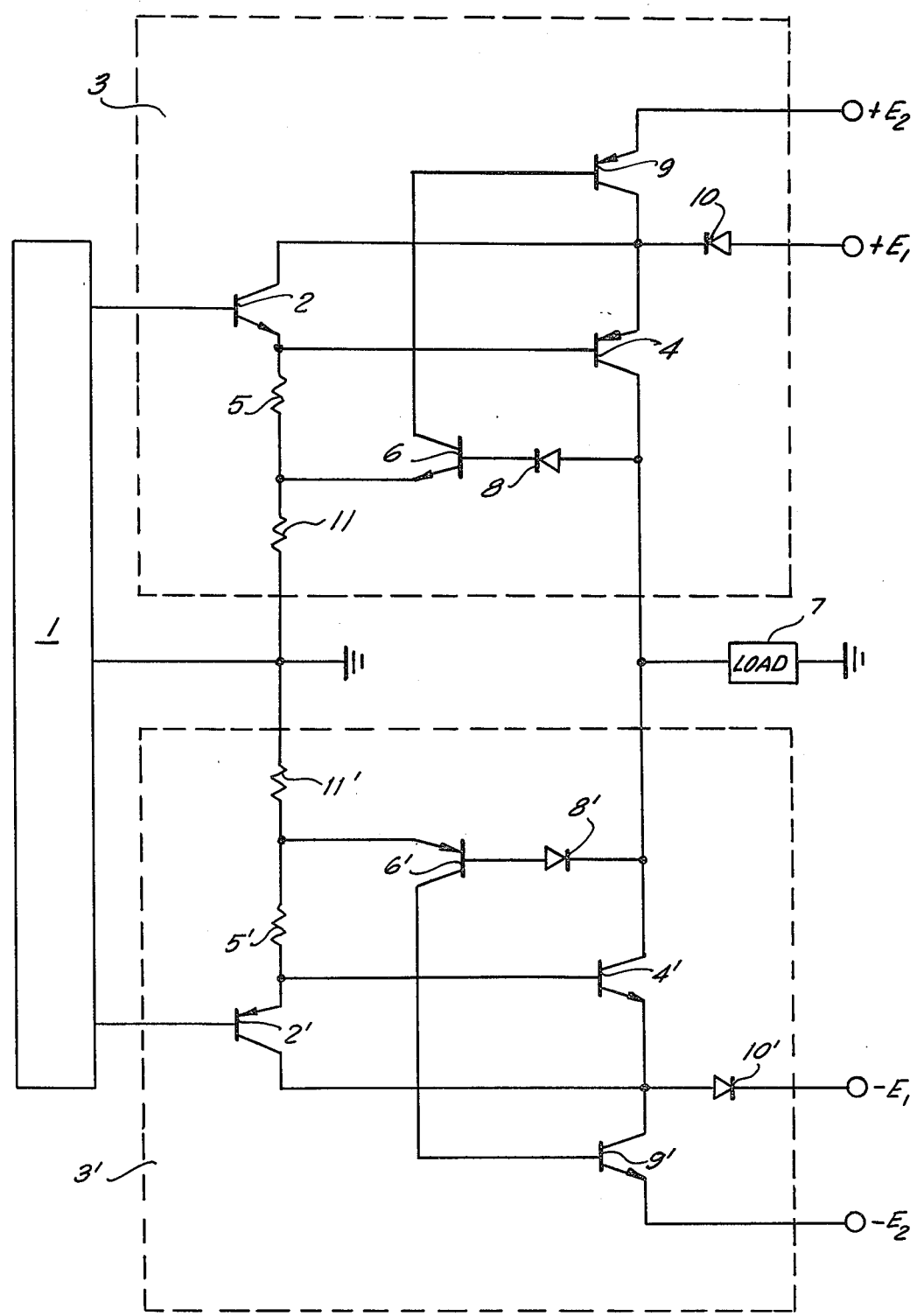

CLASS BC POWER AMPLIFIER

BACKGROUND OF THE INVENTION

This invention relates to a class BC power amplifier which is intended for use in amplifying devices where the efficiency is of primary importance and the use of an output transformer is not obligatory.

A known class BC power amplifier comprises a symmetrical push-pull preamplifier and a pair of intermediate preamplifiers, the outputs of which are connected, respectively, to both power branches of the amplifier, the one power branch being connected to the positive poles of a pair of supply sources, while the other power branch is connected to the negative poles of the supply sources, both power branches and their corresponding intermediate preamplifying stages being totally symmetrical in which corresponding transistors are of opposite conductivities, wherein the outputs of the syymmetrical push-pull preamplifier are respectivly connected to the inputs of the intermediate preamplifiers, the outputs of which are respectively connected to corresponding transistors operaring in class B.

A drawback of this class BC power amplifier lies in that with the common collector connection circuit of th end transistors there cannot be used a control circuit with saturated transistor which can protect the power transistors from breakdown in transient processes caused by the inductive character of the load and it is necessary to build-in a special circuit for this purpose. Another drawback lies in that the end transistors are connected by a common collector circuit and the attacking transistor, which operates in class A conditions, must provide an amplitude greater than the whole output amplitude, which is impossible and leads to an incomplete saturation of the end power transistors, i.e. to a reduction of the maximum possible power and to great distortions of the output signal in the attacking stage itself. A further drawback lies in that the transistor, which operates in class A conditions, must be of a high-voltage type.

There are known circuits of class BC power amplifiers in which the transistor, operating in class C, is controlled by means of a Zener diode by the transistor operating in class B conditions. Thus, the aforementioned drawbacks are avoided, but this leads to a considerable reduction of efficiency, this effect being particularly strong in the range of commutation of the supply sources. The latter is a great drawback for such a control circuit for the transistors, operating in class C conditions, since the amplifier operates the longest time namely in the range of commutation. Thus, the most important characteristics of the class BC amplifier is affected, i.e. its high average statistical efficiency.

SUMMARY OF THE INVENTION

It is, therefore, a general object of this invention to provide a class BC power amplifier which permits control by a circuit with saturated transistor, this circuit effecting a protection from transient processes caused by the inductive character of the load, and the circuit for control of the end power block can drive it to its maximum possible power and allows the use of low-voltage transistors, while the circuit for control of the end block and the circuit for control of the transistors, operating in class C conditions should be such that it does not lower efficiency typical for BC class amplifiers.

This object is achieved by a class BC power amplifier which comprises a symmetrical push-pull preamplifier and a pair of intermediate preamplifiers whose outputs are connected, respectively, to both power branches of the amplifier, the one power branch being connected to the positive poles of a pair of supply sources, while the other power branch is connected to the negative poles of the supply sources, both power branches and their corresponding intermediate preamplifying stages being totally symmetrical, corresponding transistors being of opposite conductivities, each output of the symmetrical push-pull preamplifier is connected to the input of the respective intermediate preamplifier, the output of which is connected to a transistor operating in class B and is characterized in that one output of each intermediate preampifier is respectively connected directly to the base of the transistor operating in class B, which is of the p-n-p type and is connected through a resistor to the emitter of a comparison n-p-n transistor. The collector of the transistor operating in class B is connected to the active end of the load, to which through a protective diode, in the same direction with the base current in the circuit, there is connected the base of the comparison n-p-n transistor, whose collector is connected directly to the base of a p-n-p transistor operating in class C. The second output of each intermediate preamplifier is respectively connected to the emitter of the transistor operating in class B, and at the same point there are connected a commutating diode and the collector of the transistor operating in class C. The anode of the commutation diode is connected to the positive pole of the low-voltage supply source, while the emitter of the transistor operating in class C is connected to the positive pole of the high-voltage source. The emitter of the comparison transistor is grounded through an emitter resistor.

The advantages of the class BC power amplifier according to this invention are: it permits control by a circuit with transistor which besides its control functions effects also a protection of the end stage from transient processes caused by the inductive character of the loud. The circuit for control of the end power block drives it to its maximum possible power and allows the use of low-voltage transistors. At the the efficiency is not lowered, but it remains sufficiently high—corresponding to the class BC.

DESCRIPTION OF THE DRAWING

For a better understanding of the ivention reference should be made to the accompanying drawing in which there is illustrated a preferred embodiment of the invention.

DESCRIPTION OF THE PREFERRED EMBODIMENT

The drawing shows the circuit diagram of a class BC power amplifier. This power amplifier comprises a symmetrical push-pull preamplifier 1 whose outputs are connected, respectively, to both power branches 3 and 3' of the amplifier. The one power branch 3 is connected to the positive poles of a pair of supply sources and the other branch 3' is connected to the negative poles of the pair of supply sources.

Since both power branches 3 and 3' are totally symmetrical, corresponding transistors being of opposite conductivities, only the power branch 3 will be described in detail in the following description. One output of the symmetrical push-pull preamplifier 1 is connected to the input of an intermediate preamplifier 2. One output of the intermediate preamplifier 2 is connected both directly to the base of a transistor 4 operating in class B, which is of the p-n-p type, and, through a resistor 5, to the emitter of a comparison n-p-n transistor 6. The collector of transistor 4 is connected to the active end of the load 7, to which, through a protective diode 8, the pass direction with respect to the base current in the circuit, there is connected the base of the comparison n-p-n transistor 6, whose collector is connected directly to the base of a p-n-p transistor 9, operating in class C. The second output of the intermediate preamplifier 2 is connected to the emitter of the transistor 4 and, at the same point, is connected to a commutating diode 10 and the collector of transistor 9. The anode of the commutating diode 10 is connected to the positive pole of a low-voltage supply source $+E_1$, while the emitter of transistor 9 is connected to the positive pole of a high-voltage supply source $+E_2$. The emitter of the comparison transistor 6 is grounded through an emitter resistor.

The operation of the class BC power amplifier according to this invention is as follows:

At rest, there is established through the transistors 2 and 2' of the intermediate preamplifier a maximum current close to the saturation current thereof, and a minimum rest current through the transistors 4 and 4' operating in class B, while the transistors 9 and 9', operating in class C, are cut-off. When a signal is received, depending on its momentary polarity, one of the branches 3, 3' remains cut-off, while the other is opened because of the resulting cut-off of the corresponding transistor 2 or 2' of the intermediate preamplifier. When the momentary value of the input signal reaches a level about 50% of the maximum value, conditions then exist for the opening of the comparison transistor 6 or 6' and, hence, a control of the transistors 9 or 9' operarting in class C. The current of the latter passes through the transistor 4 or 4' which is then saturated.

What is claimed:

1. A class BC power amplifier having a symmetrical push-pull preamplifier and a pair of symmetrical power branches coupled, respectively, to the outputs of said push-pull preamplifier, each of said branches including a first power stage, operating in class B, coupled to the output of said branch, and an intermediate preamplifier coupled to the respective output of said push-pull preamplifier, for controlling said first power stage, characterized in that each of said branches further comprises a second power stage, operating in class C, coupled to said first power stage, and a comparison stage, coupled between said intermediate preamplifier and said branch output for controlling said second power stage.

2. A class BC power amplifier as claimed in claim 1, which further comprises a low voltage supply source and a high voltage supply source, each of said sources having a grounded center point and a positive and negative pole, the positive pole of sid low voltage source being coupled to said first power stage of one of said branches, the negative pole of said low voltage source being coupled to the first power stage of the other of said branches, the positive and negative poles of said high voltage supply source being coupled, respectively, to the second power stages of said one and said other branches.

3. A class BC power amplifier as claimed in claim 2, wherein, in each of said branches, said intermediate preamplifier comprises a transistor having a base coupled to the respective output of said push-pull preamplifier, a collector coupled to the respective pole of said low voltage supply source, and an emitter connected to said first power stage and coupled to ground.

4. A class BC power amplifier is claimed in claim 3, wherein, in each of said branches, said first power stage comprises a transistor having a base connected to the emitter of said intermediate preamplifier transistor, an emitter connected to the collector of said intermediate preamplifier transistor and coupled to said respective pole of said low voltage supply source, and a collector connected to said branch output.

5. A class BC power amplifier as claimed in claim 4, wherein, in each of said branches, said comparison stage comprises a transistor having an emitter coupled to the emitter of said intermediate preamplifier transistor, a base coupled to said branch output, and a collector connected to said second power stage.

6. A class BC power amplifier as claimed in claim 5, wherein, in each of said branches, said second power stage comprises a transistor having a base connected to the collector of said comparison stage transistor, an emitter connected to the respective pole of said high voltage supply source, and a collector connected to the emitter of said first power stage transistor.

7. A class BC power amplifier as claimed in claim 6, wherein the transistors of said one branch are of opposite conductivities, respectively, than the transistors of said other branch.

* * * * *